(12) United States Patent
Masumura et al.

(10) Patent No.: US 7,695,347 B2
(45) Date of Patent: Apr. 13, 2010

(54) METHOD AND PAD FOR POLISHING WAFER

(75) Inventors: Hisashi Masumura, Fukushima (JP);
Kazuya Tomii, Tokyo (JP); Shigenao Ito, Yamatokohriyama (JP); Kenichi Anzai, Yamatokohriyama (JP); Kenichi Inoue, Yamatokohriyama (JP)

(73) Assignees: Shin-Etsu Handotai Co., Ltd., Tokyo (JP); Rodel Nitta Company, Osaka (JP)

( * ) Notice: Subject to any disclaimer, the term of this patent is extended or adjusted under 35 U.S.C. 154(b) by 559 days.

(21) Appl. No.: 10/493,494

(22) PCT Filed: Oct. 25, 2002

(86) PCT No.: PCT/JP02/11094

§ 371 (c)(1),
(2), (4) Date: Apr. 22, 2004

(87) PCT Pub. No.: WO03/038882

PCT Pub. Date: May 8, 2003

(65) Prior Publication Data

US 2005/0014455 A1    Jan. 20, 2005

(30) Foreign Application Priority Data

Oct. 30, 2001    (JP) ............................. 2001-333233

(51) Int. Cl.
*B24B 7/19*    (2006.01)
*B24B 7/30*    (2006.01)
*B24D 11/00*    (2006.01)
*B32B 3/06*    (2006.01)

(52) U.S. Cl. ................. 451/41; 451/534; 428/306.6

(58) Field of Classification Search ............. None
See application file for complete search history.

(56) References Cited

U.S. PATENT DOCUMENTS

| | | | | |
|---|---|---|---|---|
| 4,841,680 | A * | 6/1989 | Hoffstein et al. | 451/42 |
| 6,062,968 | A * | 5/2000 | Sevilla et al. | 451/526 |
| 6,117,000 | A * | 9/2000 | Anjur et al. | 451/526 |
| 6,126,532 | A * | 10/2000 | Sevilla et al. | 451/526 |
| 6,306,021 | B1 * | 10/2001 | Masumura et al. | 451/287 |
| 6,383,065 | B1 * | 5/2002 | Grumbine et al. | 451/526 |
| 6,435,949 | B1 * | 8/2002 | Katsuoka et al. | 451/59 |

FOREIGN PATENT DOCUMENTS

| JP | 10-128674 A1 | 5/1998 |
|---|---|---|
| JP | 2001-198797 A1 | 7/2001 |
| JP | 2001-1261874 A1 | 9/2001 |

OTHER PUBLICATIONS

International Search Report for PCT/JP02/11094 mailed on Feb. 12, 2003.

\* cited by examiner

*Primary Examiner*—Bryan R Muller
(74) *Attorney, Agent, or Firm*—Rader, Fishman & Grauer PLLC

(57) ABSTRACT

A method for polishing a wafer effectively preventing a sag in an outer peripheral portion of a wafer and a polishing pad for polishing a wafer preferably used in the method for polishing a wafer are provided. The method for polishing a wafer comprises the step of: mirror-polishing a wafer with a main surface of the wafer being in contact with a polishing pad of non-woven fabric impregnated with resin, wherein a ratio of surface roughness of the polishing pad to compressibility thereof {surface roughness Ra (μm)/compressibility (%)} is 3.8 or more.

5 Claims, 2 Drawing Sheets

METHOD AND PAD FOR POLISHING WAFER

TECHNICAL FIELD

The present invention relates to a method for polishing a wafer and a polishing pad for polishing a wafer preferably used in the method for polishing a wafer.

BACKGROUND ART

Conventionally, a method for manufacturing a silicon wafer used as a semiconductor substrate generally includes a crystal growing process for producing a single crystal ingot by a Czochralski (CZ) method, a Floating Zone melting (FZ) method or the like, and a wafer manufacturing process where this single crystal ingot is sliced and at least one main surface thereof is processed into a mirror-like surface. To describe the process more detailedly, wafer manufacturing process comprises: a slicing step of slicing the single crystal ingot to obtain a thin and disk-shaped wafer; a chamfering step of chamfering a peripheral edge portion of the wafer obtained through the slicing step to prevent cracking and chipping of the wafer; a lapping step of flattening this wafer; an etching step that removes machining deformation remaining behind in the so chamfered and lapped wafer; a polishing step of making a mirror surface of the wafer; and a cleaning step of cleaning the polished wafer to remove abrasive slurry or dust particles deposited thereon. The main steps of the wafer manufacturing process are only listed above, and sometimes other steps such as a heat treating step may be added, the above one step may be performed at multiple stages and the step sequence may be changeable.

The polishing step, among the above steps, includes various forms of polishing methods. For example, a mirror-polishing method for a silicon wafer comprises various methods such as a both side polishing method to polish both surfaces of a wafer simultaneously as in the lapping step, a single wafer polishing method to polish a single wafer vacuum-chucked on a plate one by one, and a wax-free polishing method to polish a wafer held by a backing pad and a template without using adhesive such as wax. At present, there is mainly used a polishing method using a wax mount batch type one side polishing apparatus to polish one surfaces of plural wafers adhered onto a plate made of such as glass or ceramics with wax. In this polishing apparatus, the plate on which the wafers are held is placed on a turn table on which a polishing pad is adhered and with a load being applied to an upper top ring the wafer is polished while rotating the turn table and the top ring.

Generally, there are employed as the polishing pads used in the polishing methods polishing pads made of such as a non-woven cloth type or a suede type. A polishing pad of a non-woven cloth type which is fabricated by impregnating a polyester felt (having a texture of a random structure) with polyurethane, has porosity and moderate elasticity and is excellent in a polishing rate and a flatness level, so that polishing with less of a sag is achieved. This kind of polishing pad has been widely employed for stock removal polishing of a silicon wafer.

A polishing pad of a suede type has a base material of polyester felt impregnated with polyurethane, and a foamed layer is formed in the polyurethane, by removing a surface portion of the foamed layer openings being formed thereon (this layer is called a nap layer). This polishing pad is specifically used in final polishing, wherein abrasive slurry held in the foamed layer acts between a work and an inner surface of the foamed layer to thereby perform polishing of the work. Though this type of a polishing pad has been well used in chemical mechanical polishing to obtain a damage-free surface, a peripheral sag is easy to occur during long time polishing. In addition to the above polishing pads, a polishing pad such as a foamed urethane sheet is available.

As a method for fabricating a polishing pad such as a polishing pad of a non-woven cloth type or the like, there is exemplified a process for fabricating a polishing pad with arbitrary characteristic, wherein a polyester felt is impregnated with resin such as polyurethane and the surface thereof is ground with a roll-shaped grindstone attached with super hard abrasive grains thereon (this process is called buffing). A resin material, a content of impregnation thereof and a buffing condition for the surface control compressibility and other properties of the polishing pad of this kind. At present, a polishing pad with compressibility of the order of several % is used and it has been known that a polishing pad with low compressibility contributes to a reduction of the sag in an outer peripheral portion of a wafer.

It is important to keep a constant quality of each of the polished wafers in a polishing step. For the purpose, while stabilization of a polishing pad is important, especially there become issues surface roughness, compressibility, a compressive elasticity modulus, and others.

For example, if the compressibility of the polishing pad is decreased, a problem arises that the influence of precision in a polishing apparatus (a shape of a turn table, surface deflection of the turn table, vibration in processing, etc.) cannot be absorbed to deteriorate flatness of a wafer. Conversely, if the compressibility is excessively large, the amount of surface depression of the polishing pad becomes large to cause a sag in an outer peripheral portion of a wafer.

Also, as for the surface roughness of the polishing pad, in a case of a smoother surface thereof and a higher content of impregnated resin therein, a contact ratio between the polishing pad and an outer peripheral portion of a wafer rises to increase a sag in the outer peripheral portion. Conversely, in a case where the surface roughness of the polishing pad is increased by buffing it roughly, the compressibility itself becomes larger to further increase a sag in the outer peripheral portion.

DISCLOSURE OF THE INVENTION

The present invention has been made in view of the above circumstances, and therefore an object of this invention is to provide a method for polishing a wafer effectively preventing a sag in an outer peripheral portion of a wafer and a polishing pad for polishing a wafer preferably used in the method for polishing a wafer.

The surface roughness and the compressibility are properties associated with each other, and when the surface roughness becomes coarser, the compressibility tends to become larger. Though it is desired that in order to reduce a sag in an outer peripheral portion of a wafer, the surface roughness is increased to the largest value possible and the compressibility is reduced to the lowest value possible, the properties conflict with each other; therefore only one of them has been controlled so far. In order to solve the above problem, the inventors have conducted a serious study with a resultant discovery that in order to keep the flatness of the wafer, the most suitable quality of a polishing pad can be defined by employing a ratio of the properties, and have achieved the present invention.

That is to say, a method for polishing a wafer according to the present invention comprises the step of: mirror-polishing a wafer with a main surface of the wafer being in contact with a polishing pad of non-woven fabric impregnated with resin, wherein a ratio of surface roughness of the polishing pad to compressibility thereof {surface roughness Ra (μm)/compressibility (%)} is 3.8 or more.

A polishing pad for polishing a wafer according to the present invention is of non-woven fabric impregnated with resin, wherein a ratio of surface roughness of the polishing pad to compressibility thereof {surface roughness Ra (μm)/compressibility (%)} is 3.8 or more.

Since there is a tendency where the larger the ratio of the surface roughness to the compressibility, the better the flatness, no specific limitation is placed on the upper limit of the ratio, while the ratio is suitably 10 or less in view of the surface roughness and the compressibility. Especially, considering easy fabrication of the polishing cloth, the ratio is preferably on the order of from 5 to 6.

Especially, it is preferable for the compressibility to be in the range of from 2% to 4.5%. If the compressibility is less than 2%, influences of a shape of a turn table of a polishing apparatus and slight vibration in processing cannot be absorbed to thereby generate a sag in an outer peripheral portion adversely. Moreover, if the compressibility is in excess of 4.5%, surface depression of a polishing pad encourages a sag in an outer peripheral portion adversely.

The surface roughness is preferably controlled in the range of from 15 μm to 19 μm. When a wafer is polished using a polishing pad with the above mentioned range, a polished wafer with high quality can be obtained.

BEST MODE FOR CARRYING OUT THE INVENTION

Figure 4:
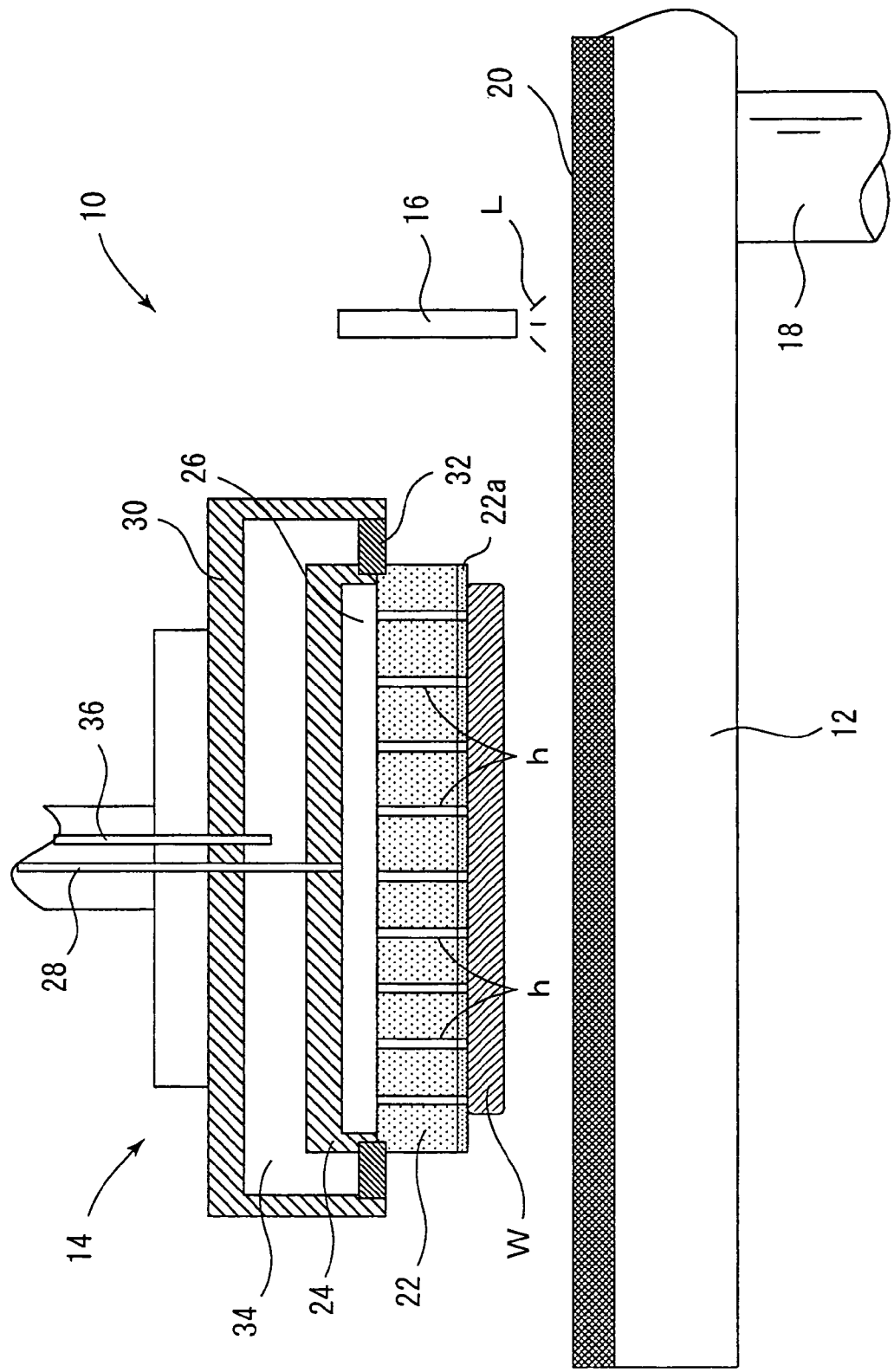
FIG. 4 is an explanatory sectional view for schematically showing an essential part of an embodiment of a polishing apparatus used in a method for polishing a wafer according to the present invention.

An embodiment of the present invention will be explained below with reference to the attached drawings. This embodiment is merely illustrative, and the present invention may be modified or changed variously without departing from the technical idea of the present invention. FIG. 4 shows an embodiment of a polishing apparatus used in a method for polishing a wafer according to the present invention and is an explanatory schematic sectional view of an essential part for showing a constructive outline of a polishing apparatus for a work equipped with a single wafer polishing head.

In FIG. 4, reference numeral 10 designates a polishing apparatus, which is constructed as an apparatus polishing a single side of a wafer W, for example, a semiconductor wafer such as a silicon wafer. The polishing apparatus 10 includes: a turn table 12; a polishing head 14; and abrasive slurry feed tube 16. The turn table 12 is rotated at a prescribed rotation rate by a rotary shaft 18 and a polishing pad 20 is adhered onto the top surface thereof.

Then, the wafer W is held on a wafer holding face 22a of a wafer holding plate body 22 of the polishing head 14 by vacuum chucking or the like, and rotated by the polishing head 14 and simultaneously pressed onto the polishing pad 20 of the turn table 12 at a prescribed load.

The abrasive slurry L is fed onto the polishing pad 20 from the abrasive slurry feed tube 16 at a prescribed flow rate, and the abrasive slurry L is fed between the wafer W and the polishing pad 20 to thereby polish a surface of the wafer W.

The polishing head 14 is constituted of a wafer holding plate body 22 with the wafer holding face 22a and many through-holes h for vacuum chucking, and a holding back plate 24, wherein the through-holes h are connected to a vacuum apparatus not shown via a vacuum recess 26 formed in the holding back plate 24 and via a vacuum path 28 to vacuum chuck the wafer W on the wafer holding face 22a by vacuum generation.

Further, there is formed a space 34 surrounded by an outer cover 30, the holding back plate 24 and an annular elastic body 32, and a compressed air feed path 36 extends into the space 34 and connected to a compressed air feeder not shown. A polishing pressure is adjustable by regulating a pressure of the compressed air feeder.

Needless to say, a polishing apparatus used in a method for polishing a wafer according to the present invention is not restricted to the embodiment shown in FIG. 4.

A method for polishing a wafer according to the present invention uses a polishing pad having a specific performance according to the present invention as the polishing pad 20, for example, in a polishing apparatus 10 as shown in FIG. 4. A polishing pad used in the method of the present invention, namely a polishing pad according to the present invention necessarily has {surface roughness (μm)/compressibility (%)} of 3.8 or more at a stage before polishing. That is to say, a quality of a polishing pad is adjusted so as to meet a prescribed condition in the present invention at an as-received state (at a stage when a polishing cloth is fabricated or purchased).

Here, the compressibility of a polishing pad is measured by a method in conformity with JIS L-1096. To be concrete, using a digital linear gage (for example, 1DB-112M made by Mitsutoyo Corporation), a thickness T1 is read after an elapse of 1 min after an initial load W0 is applied, and the load is increased to W1, a thickness T2 being read after an elapse of 1 min. Then, the compressibility (%) is calculated with an expression of $\{(T1-T2)/T1\}\times 100$. The initial load W0 is 300 g/cm$^2$ and the load W1 is 1800 g/cm$^2$ for evaluation.

The surface roughness is measured on a surface of a polishing pad with a roughness measuring instrument of contact type (for example, Surfcom 480A made by Tokyo Seimitsu Co., Ltd.) under prescribed conditions (a measuring length of 12.5 mm, a measuring speed of 0.3 mm/min, a cut-off of 2.5 mm and an Ra value).

Especially, the compressibility of a polishing pad used in the method of the present invention, that is to say, a polishing pad according to the present invention, is preferably in the range of 2% to 4.5%. Therefore, the surface roughness of a polishing pad according to the present invention is preferably controlled to be 7.6 μm or more and more preferably in the range of from 15 μm to 19 μm based on an expression of surface roughness Ra (μm)/compressibility (%)=3.8 or more, which shows a feature of the present invention. For example, for a polishing pad with the surface roughness of 18 μm, the compressibility is preferably on the order of from 2% to 4.7%, and for a polishing pad with the surface roughness of 15 μm, the compressibility is preferably on the order of from 2% to 3.9%.

Though a fabrication process for a polishing pad of the present invention is not different from a prior art process, it is necessary to pay special attention to a relationship between the compressibility and the surface roughness for the polishing pad of the present invention. When fabricating a polishing pad meeting the conditions required for the polishing pad of the present invention, for example, the conditions for fabricating the polishing pad is adjusted as follows. For example, for an non-woven cloth type polishing cloth of a polyester felt impregnated with polyurethane, an impregnation amount of polyurethane is adjusted so as to regulate the compressibility to be on the order of 2% (slightly smaller than 2%), followed by buffing a surface of the polishing pad with a grindstone with surface finish of about #100 to adjust its surface roughness and thereby meet the conditions of the present invention.

Also, in the method according to the present invention, it is required to keep a ratio of {surface roughness (μm)/compressibility (%)} of the polishing pad to be 3.8 or more even during polishing of a wafer. However, due to polishing conditions such as influences of abrasive slurry, etc. and operating time, etc., a quality of a polishing pad inevitably changes even during polishing. Therefore, in an actual polishing operation, a ratio of {surface roughness (μm)/compressibility (%)} is adjusted to fall in the above range at least at the start stage using the polishing pad. Also, in repeating polishing operations, a quality of the polishing pad is gradually changed, while a ratio of {surface roughness (μm)/compressibility (%)} is to be adjusted so as to be 3.8 or more by dressing etc. of the polishing pad in the course of the polishing operations.

EXAMPLES

While description will be given of the present invention in a more concrete manner taking up examples below, it is needless to say that the examples are shown by way of illustration only and should not be construed by way of limitation.

Experimental Example 1

A ratio of {surface roughness (μm)/compressibility (%)} of a polishing pad was changed to investigate a relationship between the ratio and wafer flatness after polishing. Using a flatness tester 9700 E+ made by ADE Corporation, flatness was measured in terms of SFQR (Site Front least sQuares <site> Range: difference of undulation in each site on a wafer surface) excluding an outer peripheral portion of 2 mm with a size of 25 mm square cell, and the max value of the cells on the wafer surface (SFQRmax) was evaluated.

With a polishing apparatus similar to the polishing apparatus shown in FIG. 4 in which there were used various polishing pads adhered thereon each having a different ratio value of {surface roughness (μm)/compressibility (%)}, 8-inch silicon wafers subjected to etching treatment were polished using abrasive slurry containing colloidal silica (at a pH value of 10.5) under polishing conditions of a polishing pressure of 300 g/cm² and a polishing time of 15 min.

Figure 1:
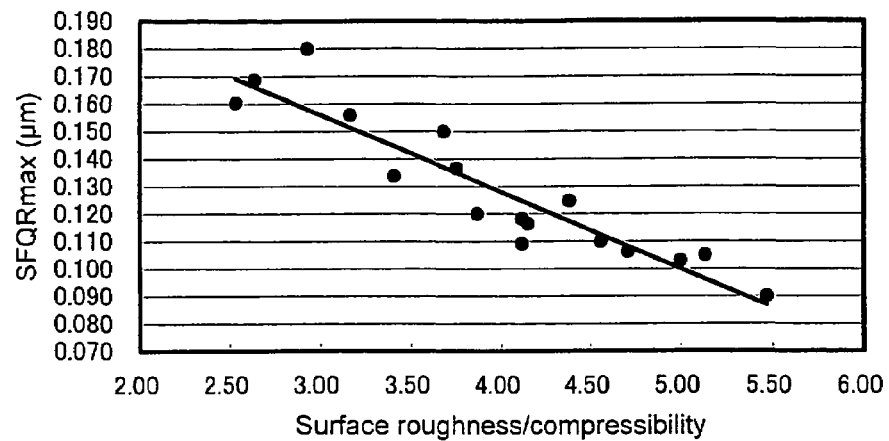
FIG. 1 is a graph showing a relationship between {surface roughness (μ)/compressibility (%)} of a polishing pad and flatness (in a case excluding an outer peripheral portion of 2 mm) of a polished wafer in Experimental Example 1.

FIG. 1 shows a relationship between results of the flatness (SFQR max: in a case excluding an outer peripheral portion of 2 mm) of the polished wafer and the ratio of {surface roughness (μm)/compressibility (%)} of the polishing pad. As shown in FIG. 1, it was found that the ratio largely affects the flatness and there was a good linear correlation between them. That is to say, it is found to be important to define a quality of the polishing pad by the ratio of {surface roughness (μm)/compressibility (%)}.

At present, there is required a quality of SFQRmax=0.13 μm or less as flatness and it is found that when defining the quality by the ratio, with the ratio of 3.8 or more, a high flatness wafer can be stably obtained.

Figure 2:
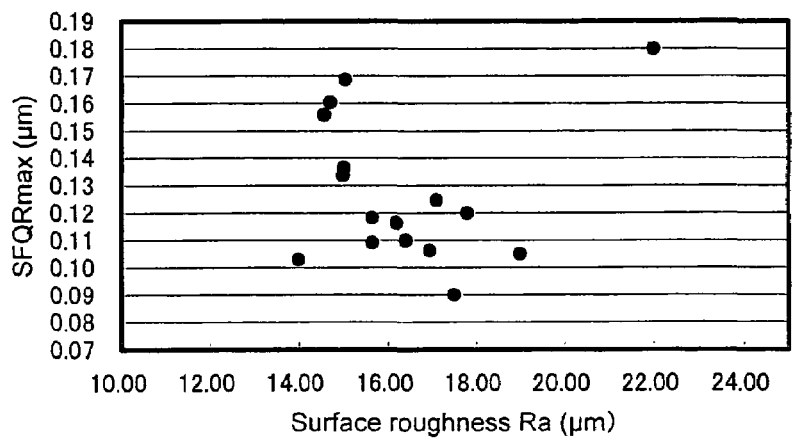
FIG. 2 is a graph showing a relationship between surface roughness (μm) of a polishing pad and flatness (in a case excluding an outer peripheral portion of 2 mm) of a polished wafer in Experimental Example 1.
Figure 3:
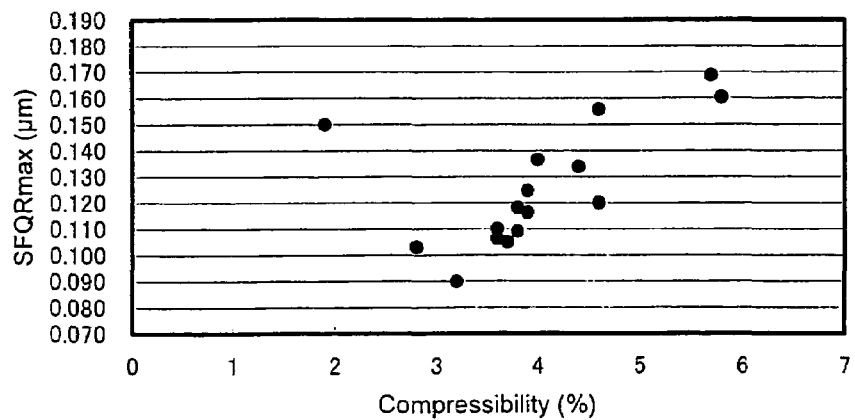
FIG. 3 is a graph showing a relationship between compressibility (%) of a polishing pad and flatness (in a case excluding an outer peripheral portion of 2 mm) of a polished wafer in Experimental Example 1.

In addition, FIG. 2 shows a relationship between the surface roughness (μm) of the polishing pad and the flatness (excluding an outer peripheral portion of 2 mm) of the polished wafer, and FIG. 3 shows a relationship between the compressibility of the polishing pad and the flatness (in a case excluding an outer peripheral portion of 2 mm) of the polished wafer. As can be understood from the figures, even if the surface roughness and the compressibility are individually controlled, their correlations with flatness are low; therefore a preferable polishing pad cannot be defined, but by adopting the ratio of {surface roughness (μm)/compressibility (%)} as in the present invention, there can be defined a polishing pad which controls the flatness easily. Especially, when the above ratio of {surface roughness (μm)/compressibility (%)} is 3.8 or more, it is preferable that there can be easily manufactured a wafer having a flatness level to be required hereafter.

Example 1

Using a polishing apparatus similar to the polishing apparatus shown in FIG. 4 having a polishing pad with the compressibility of 3.9% and the surface roughness of 16.2 μm ({surface roughness (μm)/compressibility (%)} =4.15), one hundred pieces of 8-inch silicon wafers were polished. Flatness values of the polished wafers were measured under tight conditions excluding outer peripheral portions of 3 mm and 2 mm.

As a result of polishing, flatness values of all the polished wafers were SFQRmax=0.12 μm or less. Even when evaluation was performed on a wafer surface excluding the outer peripheral portion of 2 mm, flatness values were SFQRmax=0.12 μm or less; it is found that the wafers are stably polished to be flat up to the outer peripheral portion.

Example 2

Using a polishing apparatus similar to the polishing apparatus shown in FIG. 4 having a polishing pad with the compressibility of 4.6% and the surface roughness of 17.8 μm ({surface roughness (μm)/compressibility (%)} =3.87), one hundred pieces of 8-inch silicon wafers were polished. Flatness values of the polished wafers were measured under tight conditions excluding outer peripheral portions of 3 mm and 2 mm.

As a result of polishing, flatness values of all the polished wafers were SFQRmax=0.13 μm or less. Even when evaluation was performed on a wafer surface excluding the outer peripheral portion of 2 mm, flatness values were SFQRmax=0.13 μm or less; it is found that the wafers are stably polished to be flat up to the outer peripheral portion.

Example 3

Using a polishing apparatus similar to the polishing apparatus shown in FIG. 4 having a polishing pad with the compressibility of 3.2% and the surface roughness of 17.5 μm ({surface roughness (μm)/compressibility (%)}=5.47), one hundred pieces of 8-inch silicon wafers were polished. Flatness values of the polished wafers were measured under tight conditions excluding outer peripheral portions of 3 mm and 2 mm.

As a result of polishing, flatness values of all the polished wafers were SFQRmax=0.10 μm or less. Even when evaluation was performed on a wafer surface excluding the outer peripheral portion of 2 mm, flatness values were all SFQR-max=0.10 μm or less; it is found that wafers are stably polished to be flat up to the outer peripheral portion.

Comparative Example 1

Using a polishing apparatus similar to the polishing apparatus shown in FIG. 4 having a polishing pad with the compressibility of 4.6% and the surface roughness of 14.5 μm ({surface roughness (μm)/compressibility (%)}=3.17), one hundred pieces of 8-inch silicon wafers were polished. Flatness values of the polished wafers were measured under tight conditions excluding outer peripheral portions of 3 mm and 2 mm.

As a result of polishing, flatness values of all the polished wafers were SFQRmax=0.14 μm or so on a wafer surface excluding the outer peripheral portion of 3 mm, and there were not obtained polished wafers with flatness values of 0.13 μm or less. When evaluation was performed on a wafer surface excluding the outer peripheral portion of 2 mm, the flatness values were on the order of 0.16 μm, which are inferior to those in a case excluding the outer peripheral portion of 3 mm; it is found that the outer peripheral portion of each wafer was sagged.

Capability of Exploitation in Industry:

As described above, according to the polishing method using the polishing pad of the present invention, when polishing a wafer, there can be controlled a sag on an outer peripheral portion thereof, especially a sag on an outer peripheral portion of 3 mm or less thereof, and flatness of SFQRmax=0.13 μm or less can be achieved on a wafer surface excluding an outer peripheral portion of 2 mm.

The invention claimed is:

1. A method for polishing a silicon wafer comprising the step of:
    mirror-polishing the silicon wafer with a main surface of the silicon wafer being in contact with a polishing pad of non-woven fabric impregnated with resin,
    wherein a ratio of surface roughness of the polishing pad to compressibility thereof (surface roughness Ra (μm)/ compressibility (%)) is 3.8 or more and 10 or less,
    wherein the compressibility of the polishing pad is in the range from 2% to 4.5%, and wherein the surface roughness of the polishing pad is in the range from 17μm to 19 μm,
    and wherein the polishing pad is fabricated by the following steps:
    preparing a non-woven cloth type polishing cloth of a polyester felt;
    impregnating the non-woven cloth type polishing cloth with polyurethane;
    adjusting the impregnation amount of polyurethane so as to regulate compressibility to be on the order of 2%;
    buffing a surface of the polishing pad with a grindstone with surface finish of about #100 to adjust its surface roughness.

2. A polishing pad for polishing a silicon wafer, of non-woven fabric impregnated with resin, wherein a ratio of surface roughness of the polishing pad to compressibility thereof (surface roughness Ra (μm)/ compressibility (%)) is 3.8 or more and 10 or less,
    wherein the compressibility of the polishing pad is in the range from 2% to 4.5%, and wherein the surface roughness of the polishing pad is in the range from 17μm to 19 μm,
    and wherein the polishing pad is fabricated by the following steps:
    preparing a non-woven cloth type polishing cloth of a polyester felt;
    impregnating the non-woven cloth type polishing cloth with polyurethane;
    adjusting the impregnation amount of polyurethane so as to regulate compressibility to be on the order of 2%;
    buffing a surface of the polishing pad with a grindstone with surface finish of about #100 to adjust its surface roughness.

3. A method for polishing a silicon wafer comprising the step of:
    mirror-polishing the silicon wafer with a main surface of the silicon wafer being in contact with a polishing pad of non-woven fabric impregnated with resin,
    the main surface of the silicon wafer being subjected to alkali conditions by using an abrasive slurry containing colloidal silica with the abrasive slurry contacting the polishing pad,
    wherein a ratio of surface roughness of the polishing pad to compressibility thereof (surface roughness Ra (μm)/ compressibility (%)) is 3.8 or more and 10 or less,
    wherein the compressibility of the polishing pad is in the range from 2% to 4.5% and the surface roughness of the polishing pad is in the range from 15 μm to 19 μm,
    and wherein the polishing pad is fabricated by the following steps:
    preparing a non-woven cloth type polishing cloth of a polyester felt;
    impregnating the non-woven cloth type polishing cloth with polyurethane;
    adjusting the impregnation amount of polyurethane so as to regulate compressibility to be on the order of 2%;
    buffing a surface of the polishing pad with a grindstone with surface finish of about #100 to adjust its surface roughness.

4. A method according to claim 3, wherein the alkali conditions are approximately a pH value of 10.5.

5. A method according to claim 4, wherein the step of mirror-polishing occurs at a polishing pressure of approximately 300 g/cm$^2$.

* * * * *